United States Patent
Lee et al.

(10) Patent No.: US 11,552,250 B2
(45) Date of Patent: Jan. 10, 2023

(54) POLYMER AND ORGANIC THIN FILM AND THIN FILM TRANSISTOR AND ELECTRONIC DEVICE

(71) Applicant: Samsung Electronics Co., Ltd., Suwon-si (KR)

(72) Inventors: Don-Wook Lee, Seoul (KR); Youngjun Yun, Yongin-si (KR); Jeong Il Park, Seongnam-si (KR); Jiyoung Jung, Seoul (KR); Yasutaka Kuzumoto, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 198 days.

(21) Appl. No.: 16/902,486

(22) Filed: Jun. 16, 2020

(65) Prior Publication Data

US 2021/0036229 A1  Feb. 4, 2021

(30) Foreign Application Priority Data

Jul. 30, 2019  (KR) .................... 10-2019-0092553
May 25, 2020  (KR) .................... 10-2020-0062311

(51) Int. Cl.
*H01L 51/00*  (2006.01)
*C08G 61/12*  (2006.01)
(Continued)

(52) U.S. Cl.
CPC ........ *H01L 51/0036* (2013.01); *C08G 61/126* (2013.01); *C08J 5/18* (2013.01);
(Continued)

(58) Field of Classification Search
CPC ............ H01L 51/0036; H01L 51/0043; H01L 51/0541; H01L 51/0545; H01L 51/0558;
(Continued)

(56) References Cited

U.S. PATENT DOCUMENTS 7,816,673 B2  10/2010  Park et al.
2006/0054883 A1*  3/2006  Hanna ................. H01L 51/0558
257/40
(Continued)

FOREIGN PATENT DOCUMENTS

EP  3434679 A2  1/2019
JP  2013/235903 A  11/2013
(Continued)

OTHER PUBLICATIONS

Jeong-Il Park et al, 'Dibenzothiopheno[6,5-b:6',5'-f]thieno[3,2-b]thiophene (DBTTT): High-Performance Small-Molecule Organic Semiconductor for Field-Effect Transistors' Journal of the American Chemical Society, vol. 137, Mar. 2015, pp. 12175-12178. (Year: 2015).*

(Continued)

*Primary Examiner* — John P. Dulka
(74) *Attorney, Agent, or Firm* — Harness, Dickey & Pierce, P.L.C.

(57) ABSTRACT

Disclosed are a polymer including at least one structural unit with a moiety represented by Chemical Formula 1, an organic thin film including the polymer, a thin film transistor, and an electronic device.

(Continued)

[Chemical Formula 1]

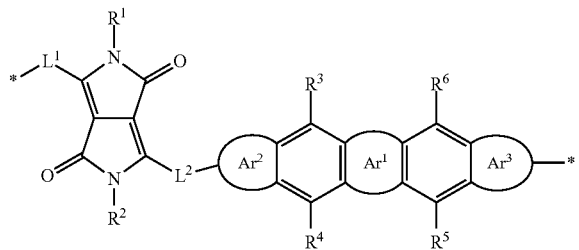

In Chemical Formula 1, $Ar^1$ to $Ar^3$, $L^1$, $L^2$, and $R^1$ to $R^6$ are the same as described in the detailed description.

21 Claims, 5 Drawing Sheets

(51) Int. Cl.
 C08J 5/18 (2006.01)
 H01L 51/05 (2006.01)
(52) U.S. Cl.
 CPC .... *H01L 51/0043* (2013.01); *C08G 2261/124* (2013.01); *C08G 2261/148* (2013.01); *C08G 2261/3223* (2013.01); *C08G 2261/3241* (2013.01); *C08G 2261/3243* (2013.01); *C08G 2261/411* (2013.01); *C08G 2261/51* (2013.01); *C08G 2261/92* (2013.01); *C08J 2365/00* (2013.01); *H01L 51/0541* (2013.01); *H01L 51/0545* (2013.01); *H01L 51/0558* (2013.01)
(58) Field of Classification Search
 CPC .............. H01L 51/0034; C08G 61/126; C08G 2261/124; C08G 2261/148; C08G 2261/3223; C08G 2261/3241; C08G 2261/3243; C08G 2261/411; C08G 2261/51; C08G 2261/92; C08G 2261/1412; C08G 2261/334; C08G 2261/344; C08G 2261/364; C08G 2261/512; C08J 5/18; C08J 2365/00; H01B 1/127
 See application file for complete search history.

(56) References Cited

U.S. PATENT DOCUMENTS

| | | | |
|---|---|---|---|
| 2014/0128618 A1 | 5/2014 | Hayoz et al. | |
| 2015/0111337 A1 | 4/2015 | Welker et al. | |
| 2017/0331045 A1 | 11/2017 | Chung et al. | |
| 2017/0355716 A1 | 12/2017 | Lee et al. | |
| 2018/0287066 A1* | 10/2018 | Bronstein | H01L 51/0043 |
| 2019/0036037 A1 | 1/2019 | Lee et al. | |
| 2020/0075867 A1* | 3/2020 | Lee | H01L 51/0071 |
| 2020/0168806 A1* | 5/2020 | Lee | H01L 51/05 |
| 2021/0036229 A1* | 2/2021 | Lee | H01L 51/0036 |
| 2022/0145003 A1* | 5/2022 | Bianchi | H01L 51/0036 |

FOREIGN PATENT DOCUMENTS

| | | | | |
|---|---|---|---|---|
| KR | 101314998 B1 | 10/2013 | | |
| WO | WO-2012/175530 A1 | 12/2012 | | |
| WO | WO-2012175530 A1 * | 12/2012 | ............ | B82Y 10/00 |
| WO | WO-2013/149897 A1 | 10/2013 | | |

OTHER PUBLICATIONS

Extended European Search Report dated Dec. 11, 2020, issued in corresponding European Patent Application No. 20180213.9.
Yunfeng Deng et al., 'Low-Band-Gap Conjugated Polymers of Dithieno[2,3-*b*:7,6-*b*]carbazole and Diketopyrrolopyrrole: Effect of the Alkyl Side Chain on Photovoltaic Properties' *ACS Applied Materials and Interfaces*, vol. 5, 2013, pp. 5741-5747.

\* cited by examiner

POLYMER AND ORGANIC THIN FILM AND THIN FILM TRANSISTOR AND ELECTRONIC DEVICE

This application claims priority to and the benefit of Korean Patent Application No. 10-2019-0092553, filed in the Korean Intellectual Property Office on Jul. 30, 2019, and Korean Patent Application No. 10-2020-0062311, filed in the Korean Intellectual Property Office on May 25, 2020, the entire contents of each of which are incorporated herein by reference.

BACKGROUND

1. Field

A polymer, an organic thin film, a thin film transistor, and an electronic device are disclosed.

2. Description of Related Art

A flat panel display, such as a liquid crystal display (LCD) or an organic light emitting diode (OLED) display includes a thin film transistor (TFT) that is a three-terminal element as a switching device or a driving device. The thin film transistor includes a gate electrode, a source electrode, and a drain electrode, and a semiconductor for controlling the current between a source electrode and a drain electrode by a gate voltage.

The organic thin film transistor (OTFT) includes an organic semiconductor such as a low molecular compound or polymer instead of an inorganic semiconductor such as silicon (Si) as a semiconductor.

The organic thin film transistor may be made into a fiber or a film due to characteristics of an organic material, and thus is drawing attention as a core element for a flexible display device. The organic thin film transistor may be manufactured using a solution process such as inkjet printing, and may be easily applied to a large area flat panel display where a deposition process has a limit.

SUMMARY

An embodiment provides a polymer that may be applied to an organic device such as an organic thin film transistor.

Another embodiment provides an organic thin film including the polymer.

Another embodiment provides a thin film transistor including the polymer.

Another embodiment provides an electronic device including the thin film transistor.

According to an embodiment, a polymer including at least one structural unit, the at least one structural unit having a moiety represented by Chemical Formula 1, is provided.

[Chemical Formula 1]

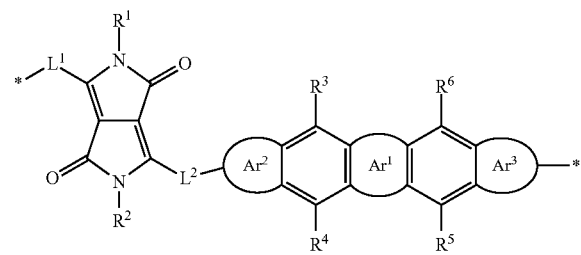

In Chemical Formula 1, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $Ar^2$ and $Ar^3$ are each independently a substituted or unsubstituted furan, a substituted or unsubstituted thiophene, a substituted or unsubstituted selenophene, or a substituted or unsubstituted tellurophene, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^6$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and \* is a linking point.

In some embodiments, the moiety represented by Chemical Formula 1 may be represented by Chemical Formula 1A or 1B.

[Chemical Formula 1A]

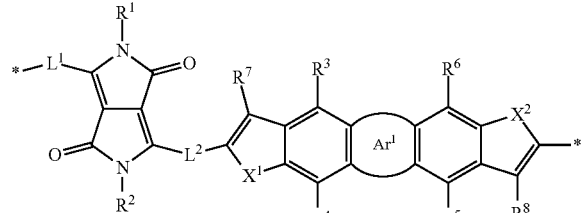

[Chemical Formula 1B]

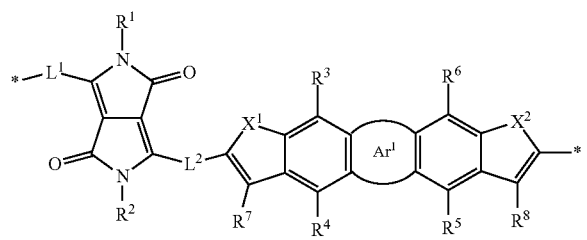

In Chemical Formula 1A or 1B, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $X^1$ and $X^2$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

In some embodiments, least one of $L^1$ and $L^2$ may be a divalent linking group including a substituted or unsubstituted C6 to C30 arylene group; a divalent linking group including a substituted or unsubstituted C3 to C30 heterocyclic group including at least one of O, S, Se, Te, and N; or a combination thereof.

In some embodiments, $L^1$ and $L^2$ may each independently be a divalent linking group including at least one substituted or unsubstituted furan, at least one substituted or unsubstituted thiophene, at least one substituted or unsubstituted selenophene, at least one substituted or unsubstituted tellurophene, at least one substituted or unsubstituted pyrrole, at least one substituted or unsubstituted benzene, or a fused ring of two or more foregoing groups.

In some embodiments, $L^1$ and $L^2$ may each independently be one linking group among linking groups listed in Group 1.

[Group 1]

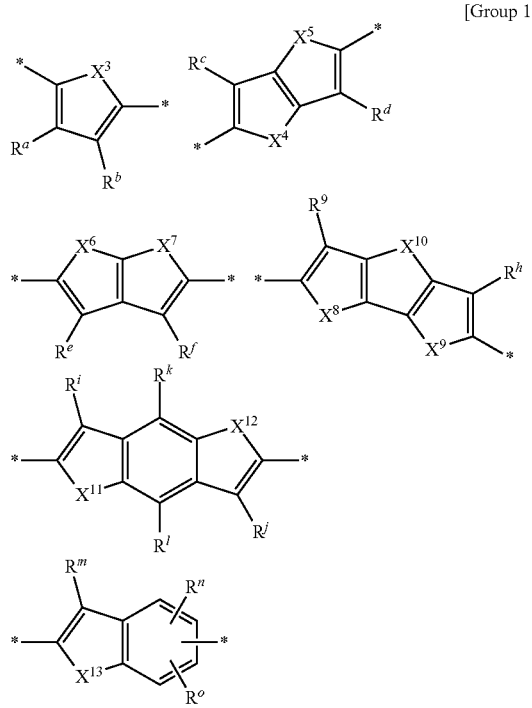

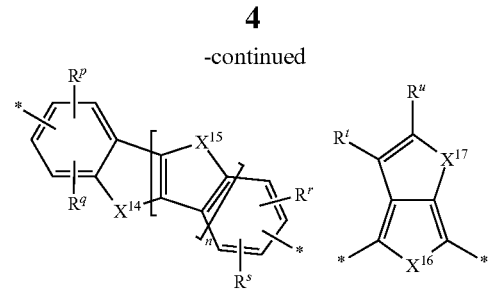

In Group 1, $X^3$ to $X^9$ and $X^{11}$ to $X^{17}$ are each independently O, S, Se, or Te, $X^{10}$ is O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, n is 0, 1, or 2, and

* is a linking point.

In some embodiments, at least one of $R^3$ to $R^6$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

In some embodiments, $R^3$ and $R^5$ may each independently be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof, and $R^4$ and $R^6$ may be hydrogen.

In some embodiments, at least one of $R^1$ and $R^2$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

In some embodiments, the moiety represented by Chemical Formula 1 may be represented by Chemical Formula 1A-1, 1A-2, 1B-1, or 1B-2.

[Chemical Formula 1A-1]

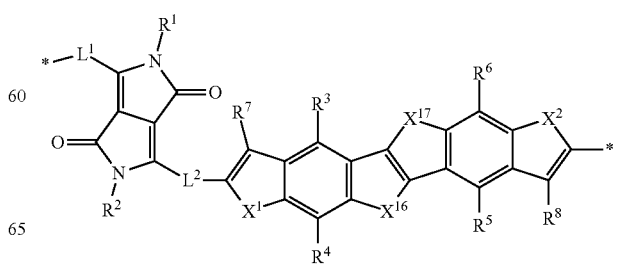

-continued

[Chemical Formula 1A-2]

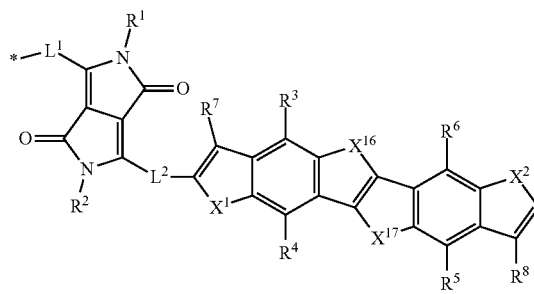

[Chemical Formula 1B-1]

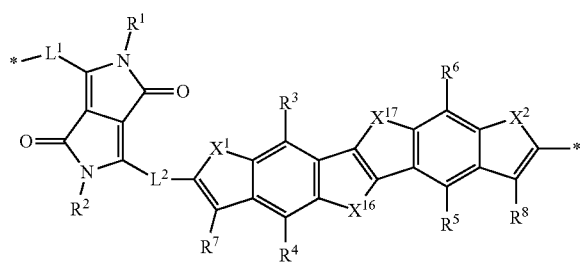

[Chemical Formula 1B-2]

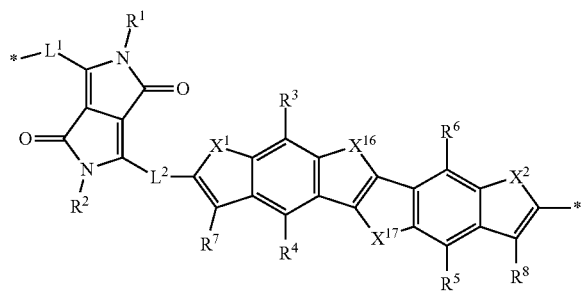

In Chemical Formula 1A-1, 1A-2, 1B-1, or 1B-2, $X^1$, $X^2$, $X^{16}$, and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

In some embodiments, the structural unit may be represented by Chemical Formula 1C or 1D.

[Chemical Formula 1C]

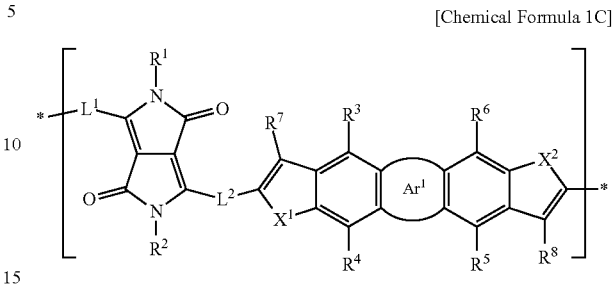

[Chemical Formula 1D]

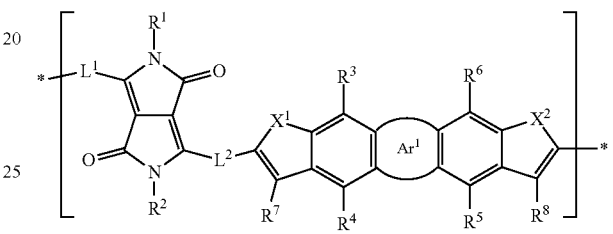

In Chemical Formula 1C or 1D, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $X^1$ and $X^2$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

In some embodiments, the structural unit represented by Chemical Formula 1C may be represented by Chemical Formula 1C-1 or 1C-2, and the structural unit represented by Chemical Formula 1D may be represented by Chemical Formula 1D-1 or 1D-2.

[Chemical Formula 1C-1]

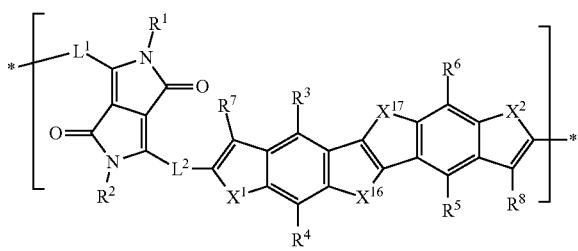

[Chemical Formula 1C-2]

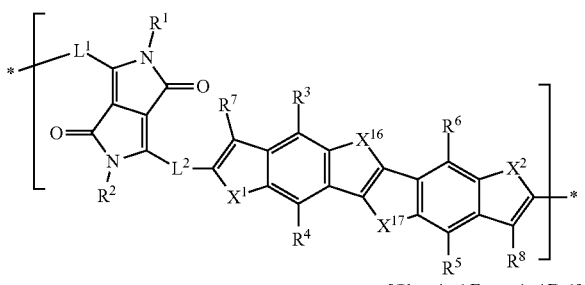

[Chemical Formula 1D-1]

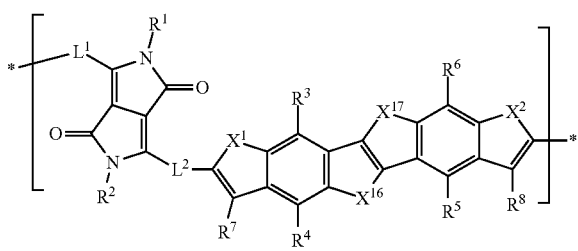

[Chemical Formula 1D-2]

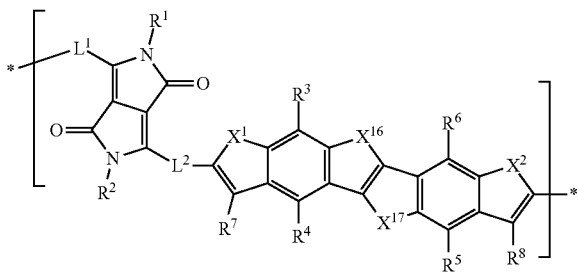

In Chemical Formula 1C-1, 1C-2, 1D-1, or 1D-2, $X^1$, $X^2$, $X^{16}$, and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

In some embodiments, $L^1$ and $L^2$ may each independently be one linking group among linking groups listed in Group 1.

[Group 1]

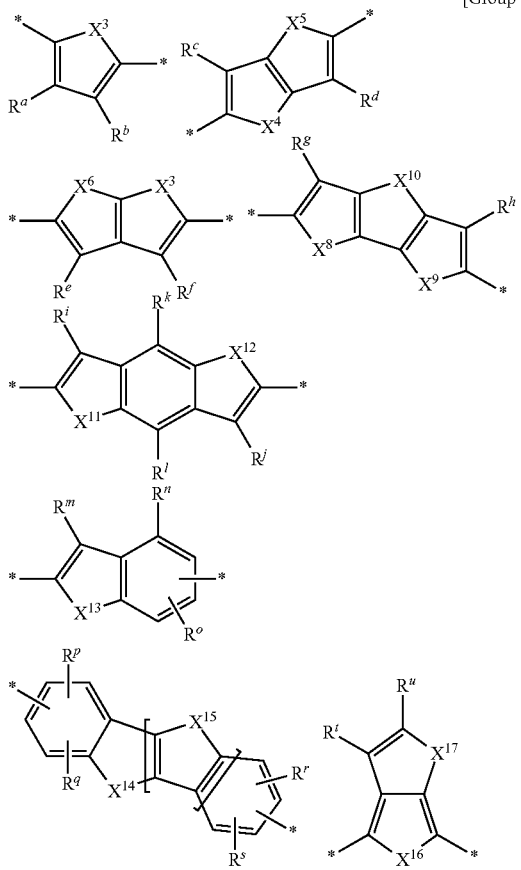

In Group 1, $X^3$ to $X^9$ and $X^{11}$ to $X^{17}$ are each independently O, S, Se, or Te, $X^{10}$ is O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, n is 0, 1, or 2, and

* is a linking point.

In some embodiments, at least one of $R^3$ to $R^6$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

In some embodiments, $R^3$ and $R^5$ may each independently be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof, and $R^4$ and $R^6$ may be hydrogen.

In some embodiments, the polymer may be represented by one of Chemical Formulae 2 to 5.
[Chemical Formula 2]
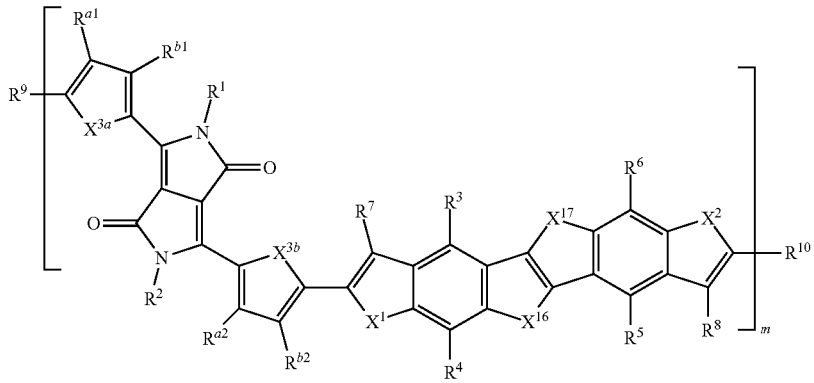
[Chemical Formula 3]
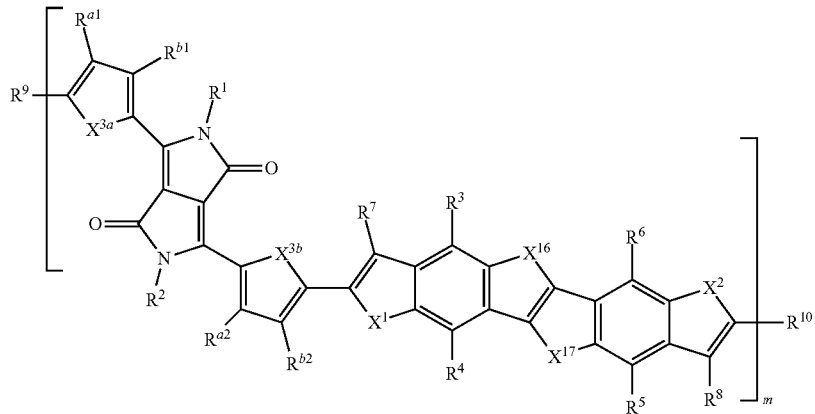
[Chemical Formula 4]
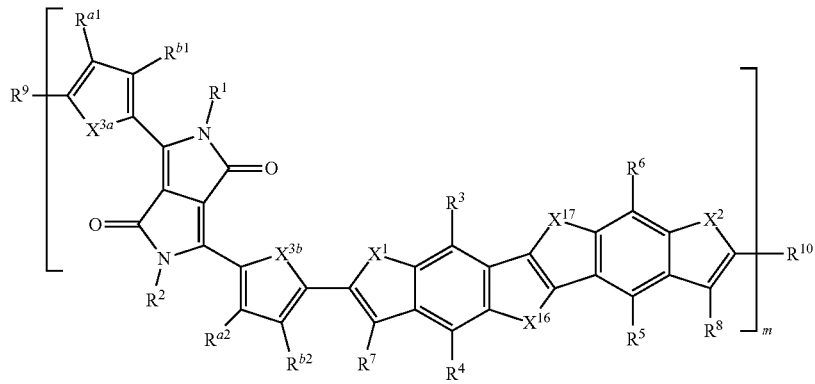
[Chemical Formula 5]
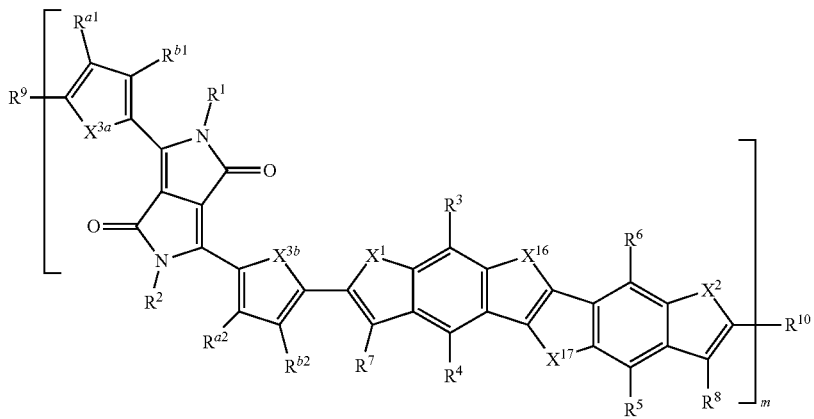

In Chemical Formulae 2 to 5, $X^1$, $X^2$, $X^{3a}$, $X^{3b}$, $X^{16}$, and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^{10}$, $R^{a1}$, $R^{b1}$, $R^{a2}$, and $R^{b2}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and m is 5 to 300.

In some embodiments, in Chemical Formulae 2 to 5, at least one of $R^3$ to $R^6$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

According to another embodiment, an organic thin film including the polymer is provided.

According to another embodiment, an electronic device including the organic thin film is provided.

According to another embodiment, a thin film transistor includes a gate electrode, an organic semiconductor overlapping the gate electrode, and a source electrode and a drain electrode electrically connected to the organic semiconductor, wherein the organic semiconductor includes the polymer.

According to another embodiment, an electronic device including the thin film transistor is provided.

The polymer may be applied effectively to a solution process and may improve charge mobility.

DETAILED DESCRIPTION

Figure 1A:
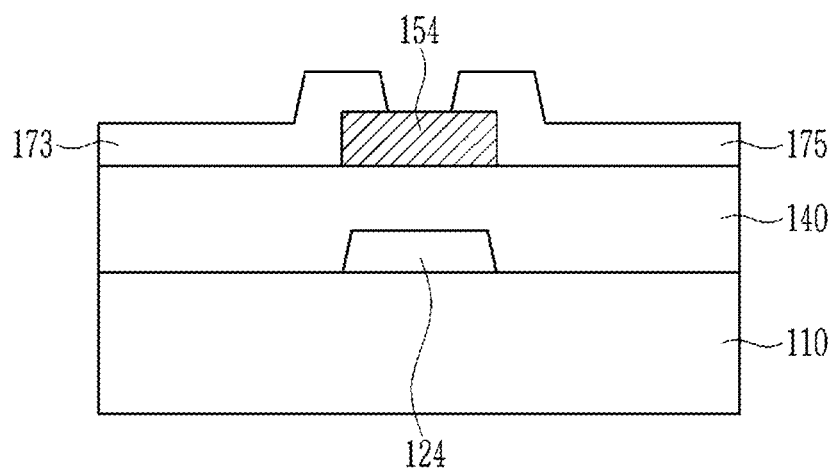
FIGS. 1A to 1C are cross-sectional views of a thin film transistor according to embodiments.

Example embodiments will hereinafter be described in detail, and may be easily performed by those who have common knowledge in the related art. However, this disclosure may be embodied in many different forms and is not to be construed as limited to the example embodiments set forth herein.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms selected from, N, O, S, Se, Te, Si, and P.

As used herein, when a definition is not otherwise provided, "alkyl group" may be a linear or branched saturated monovalent hydrocarbon group (e.g., a methyl group, an ethyl group, a propyl group, an isobutyl group, a sec-butyl group, a tert-butyl group, a pentyl group, an iso-amyl group, a hexyl group, and the like).

As used herein, when a definition is not otherwise provided, "alkenyl group" refers to a linear or branched saturated monovalent hydrocarbon group including at least one carbon-carbon double bond (e.g., an ethenyl group).

As used herein, when a definition is not otherwise provided, "alkynyl group" refers to a linear or branched saturated monovalent hydrocarbon group including at least one carbon-carbon triple bond (e.g., ethynyl group).

As used herein, when a definition is not otherwise provided, "alkoxy group" may refer to an alkyl group that is linked via an oxygen, e.g., a methoxy group, an ethoxy group, and a sec-butyloxy group.

As used herein, when a definition is not otherwise provided, "aryl group" refers to a monovalent functional group formed by the removal of one hydrogen atom from one or more rings of an arene, e.g., phenyl or naphthyl. The arene refers to a hydrocarbon having an aromatic ring, and includes monocyclic and polycyclic hydrocarbons wherein the additional ring(s) of the polycyclic hydrocarbon may be aromatic or nonaromatic.

As used herein, when a definition is not otherwise provided, "arylalkyl group" refers to an alkyl group where at least one hydrogen atom is replaced by an aryl group.

As used herein, when a definition is not otherwise provided, "alkylaryl group" refers to an aryl group where at least one hydrogen atom is replaced by an alkyl group.

As used herein, when a definition is not otherwise provided, "aryloxy group" refers to an aryl group that is linked via oxygen, and the aryl group is the same as described above.

As used herein, when a definition is not otherwise provided, "arylalkyl group" refers to an aryl group in which at least one hydrogen is replaced by a lower alkylene, e.g., methylene, ethylene, propylene, and the like. For example, the "arylalkyl group" may be a benzyl group or a phenylethyl group.

As used herein, when a definition is not otherwise provided, "cycloalkyl group" refers to a monovalent functional group having one or more saturated rings in which all ring members are carbon, e.g., a cyclopentyl group and a cyclohexyl group.

As used herein, when a definition is not otherwise provided, "heteroalkyl group" refers to the alkyl group described above in which methylene (—$CH_2$—) is replaced by —O—, —S—, —S(=O)$_2$—, —Se—, or —NR— (wherein R is each independently hydrogen or a C1 to C10 alkyl group).

As used herein, when a definition is not otherwise provided, "arylheteroalkyl group" refers to a heteroalkyl group described above in which at least one hydrogen atom is replaced by an aryl group.

As used herein, when a definition is not otherwise provided, "heteroarylalkyl group" is the alkyl group described above in which at least one hydrogen atom is replaced by a heteroaryl group.

As used herein, when a definition is not otherwise provided, "alkylheteroaryl group" refers to a heteroaryl group described above in which at least one hydrogen atom is replaced by an alkyl group.

As used herein, when a definition is not otherwise provided, "aromatic ring" refers to a functional group in which all atoms in the cyclic functional group have a p-orbital, and wherein these p-orbitals are conjugated. For example, the aromatic ring may be a C6 to C20 aryl group.

Hereinafter, a polymer according to an embodiment is described.

The polymer according to an embodiment includes at least one structural unit that is the same or different from each other, and at least one of the structural units includes a moiety represented by Chemical Formula 1.

[Chemical Formula 1]

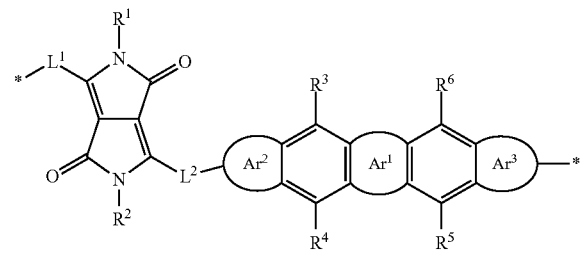

In Chemical Formula 1, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $Ar^2$ and $Ar^3$ are each independently a substituted or unsubstituted furan, a substituted or unsubstituted thiophene, a substituted or unsubstituted selenophene, or a substituted or unsubstituted tellurophene, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^6$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

The polymer may simultaneously improve solubility, charge mobility, and stretchability by including structural units including a diketopyrrolopyrrole moiety and a fused polycyclic aromatic moiety including five or more rings.

For example, the diketopyrrolopyrrole moiety may be substituted with the substituents, $R^1$ and/or $R^2$. For example, at least one of $R^1$ and $R^2$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof. For example, $R^1$ and $R^2$ may each independently be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof. Accordingly, solubility of the polymer may be further improved.

For example the fused polycyclic aromatic moiety may include five or six fused rings, for example six fused rings.

For example, the fused polycyclic aromatic moiety may be substituted with at least one substituent, that is, at least one of $R^3$ to $R^6$. For example, at least one of $R^3$ to $R^6$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof. For example, at least two of $R^3$ to $R^6$ may be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof. For example, $R^3$ and $R^5$ may each independently be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof and $R^4$ and $R^6$ may each independently be hydrogen. For example, $R^4$ and $R^6$ may each independently be a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof, and $R^3$ and $R^5$ may each independently be hydrogen. Accordingly, solubility of the polymer may be further improved.

For example, the diketopyrrolopyrrole moiety and the fused polycyclic aromatic moiety may be linked with each other by linking groups, $L^1$ and $L^2$. $L^1$ and/or $L^2$ may be for example a substituted or unsubstituted C1 to C20 alkylene group, a substituted or unsubstituted C6 to C30 arylene group, a substituted or unsubstituted C3 to C30 heterocyclic group, a fused ring thereof, or a combination thereof. $L^1$ and/or $L^2$ may be for example a substituted or unsubstituted C6 to C30 arylene group, a substituted or unsubstituted C3 to C30 heterocyclic group, a fused ring thereof, or a combination thereof.

For example, $L^1$ and/or $L^2$ may be for example a divalent linking group including a substituted or unsubstituted C6 to C30 arylene group, a substituted or unsubstituted C3 to C30 heterocyclic group including at least one of O, S, Se, Te, and N, or a combination thereof, for example a divalent linking group including at least one substituted or unsubstituted furan, at least one substituted or unsubstituted thiophene, at least one substituted or unsubstituted selenophene, at least one substituted or unsubstituted tellurophene, at least one substituted or unsubstituted pyrrole, at least one substituted or unsubstituted benzene, or a fused ring of two or more foregoing groups.

For example, $L^1$ and/or $L^2$ may be for example a divalent linking group including at least one substituted or unsubstituted benzene; at least one substituted or unsubstituted furan; at least one substituted or unsubstituted thiophene; at least one substituted or unsubstituted selenophene; at least one substituted or unsubstituted tellurophene; at least one substituted or unsubstituted naphthalene; at least one substituted or unsubstituted anthracene; at least one substituted or unsubstituted tetracene; a fused ring of at least one substituted or unsubstituted benzene and at least one substituted or unsubstituted furan; a fused ring of at least one substituted or unsubstituted benzene and at least one substituted or unsubstituted thiophene; a fused ring of at least one substituted or unsubstituted benzene and at least one substituted or unsubstituted selenophene; a fused ring of at least one substituted or unsubstituted benzene and at least one substituted or unsubstituted tellurophene; a fused ring of at least two substituted or unsubstituted furans; a fused ring of at least two substituted or unsubstituted thiophenes; a fused ring of at least two substituted or unsubstituted selenophenes; a fused ring of at least two substituted or unsubstituted tellurophenes; a fused ring of at least one substituted or unsubstituted furan and at least one substituted or unsubstituted thiophene; a fused ring of at least one substituted or unsubstituted furan and at least one substituted or unsubstituted selenophene; a fused ring of at least one substituted or unsubstituted furan and at least one substituted or unsubstituted tellurophene; a fused ring of at least one substituted or unsubstituted thiophene and at least one substituted or unsubstituted selenophene; a fused ring of at least one substituted or unsubstituted thiophene and at least one substituted or unsubstituted tellurophene; or a fused ring of at least one substituted or unsubstituted selenophene and at least one substituted or unsubstituted tellurophene, but are not limited thereto.

For example, $L^1$ and $L^2$ may each independently be a divalent linking group including at least one substituted or unsubstituted furan, at least one substituted or unsubstituted thiophene, at least one substituted or unsubstituted selenophene, at least one substituted or unsubstituted tellurophene, at least one substituted or unsubstituted pyrrole, at least one substituted or unsubstituted benzene, or a fused ring of two or more foregoing groups.

For example, $L^1$ and $L^2$ may each independently be one of linking groups listed in Group 1, but is not limited thereto.

[Group 1]

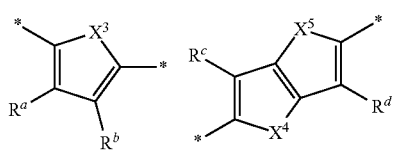

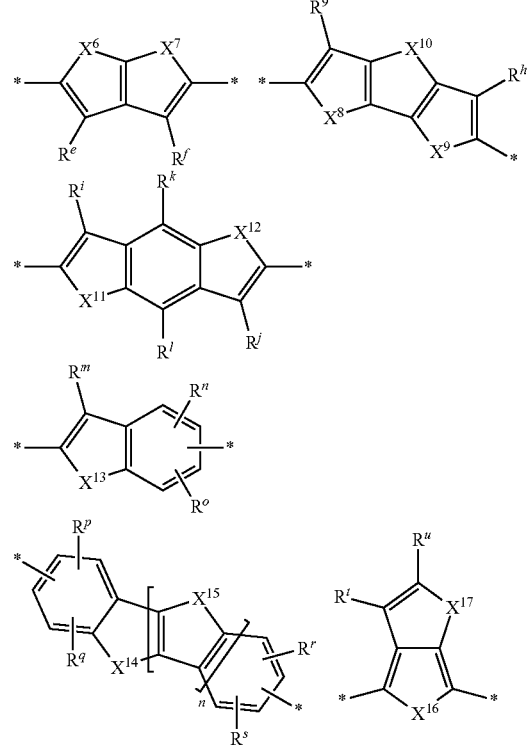

In Group 1, $X^3$ to $X^9$ and $X^{11}$ to $X^{17}$ are each independently O, S, Se, or Te, $X^{10}$ is O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, n is 0, 1, or 2, and

* is a linking point.

For example, the moiety represented by Chemical Formula 1 may be represented by Chemical Formula 1A or 1B.

[Chemical Formula 1A]

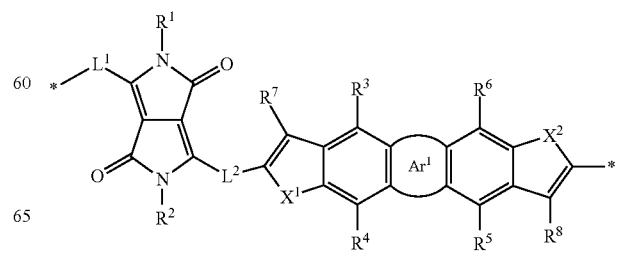

-continued

[Chemical Formula 1B]

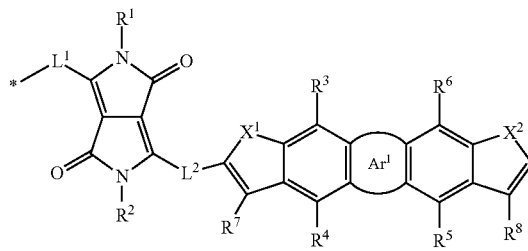

[Chemical Formula 1B-1]

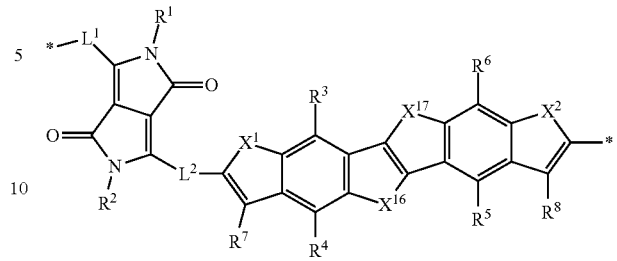

In Chemical Formula 1A or 1B, $Ar^1$, $L^1$, $L^2$, and $R^1$ to $R^6$ are the same as described above, $X^1$ and $X^2$ may each independently be O, S, Se, or Te, and $R^7$ and $R^8$ may each independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof.

For example, $X^1$ and $X^2$ may be the same.

For example, $X^1$ and $X^2$ may be different.

For example, the moiety represented by Chemical Formula 1A may be represented by Chemical Formula 1A-1 or 1A-2 and the moiety represented by Chemical Formula 1B may be represented by Chemical Formula 1B-1 or 1B-2.

[Chemical Formula 1A-1]

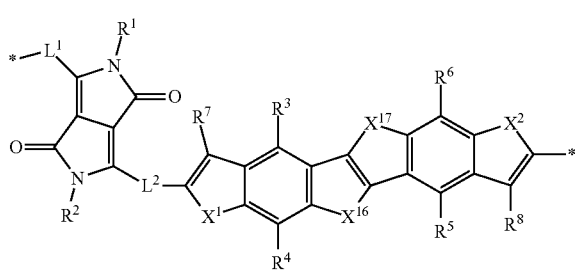

[Chemical Formula 1A-2]

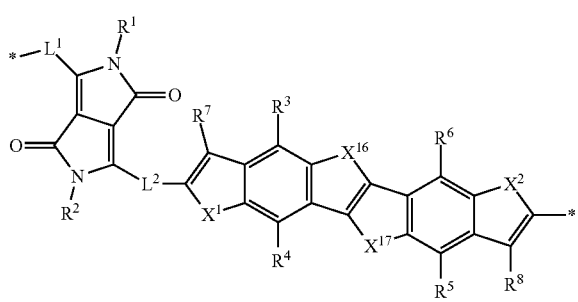

[Chemical Formula 1B-2]

In Chemical Formula 1A-1, 1A-2, 1B-1, or 1B-2, $X^1$, $X^2$, $L^1$, $L^2$, and $R^1$ to $R^8$ are the same as described above, $X^{16}$ and $X^{17}$ may each independently be O, S, Se, or Te.

For example, $X^{16}$ and $X^{17}$ may be the same.

For example, $X^{16}$ and $X^{17}$ may be different.

For example, $X^1$, $X^2$, $X^{16}$, and $X^{17}$ may be the same.

The structural unit may further include other moieties in addition to the moiety represented by Chemical Formula 1. For example the structural unit may further include a substituted or unsubstituted C6 to C30 aromatic ring and/or a substituted or unsubstituted C3 to C30 heterocycle including at least one of O, S, Se, Te, and N, in addition to the moiety represented by Chemical Formula 1. For example the structural unit of the polymer may further include a fused polycyclic aromatic moiety that is the same as or different from the aforementioned fused polycyclic aromatic moiety, in addition to the moiety represented by Chemical Formula 1.

For example, the polymer may include a structural unit consisting of the moiety represented by Chemical Formula 1. The structural unit of the polymer may be for example represented by Chemical Formula 1C or 1D.

[Chemical Formula 1C]

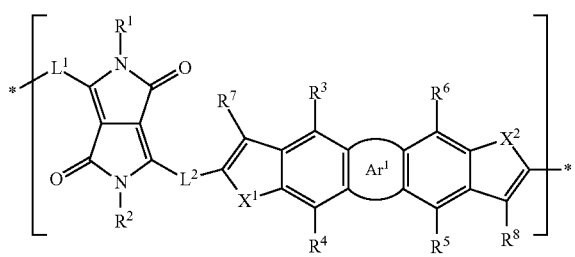

[Chemical Formula 1D]

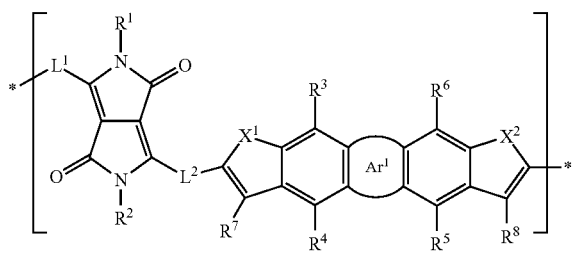

In Chemical Formula 1C or 1D, $Ar^1$, $X^1$, $X^2$, $L^1$, $L^2$, and $R^1$ to $R^8$ are the same as described above.

For example, the structural unit represented by Chemical Formula 1C may be represented by Chemical Formula 1C-1 or 1C-2 and the structural unit represented by Chemical Formula 1D may be represented by Chemical Formula 1D-1 or 1D-2.

[Chemical Formula 1C-1]

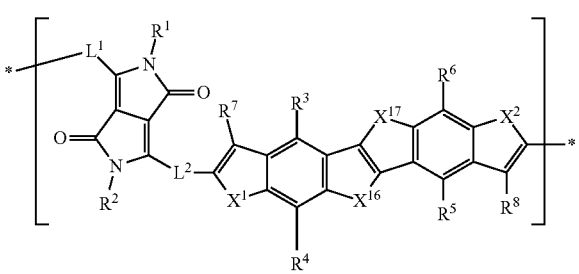

[Chemical Formula 1C-2]

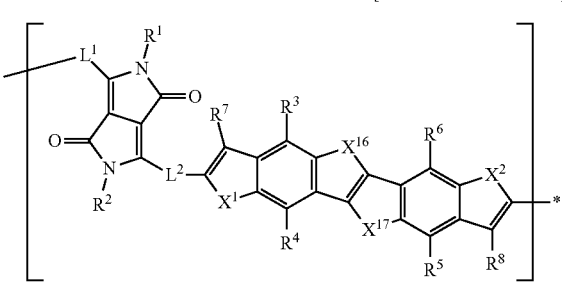

[Chemical Formula 1D-1]

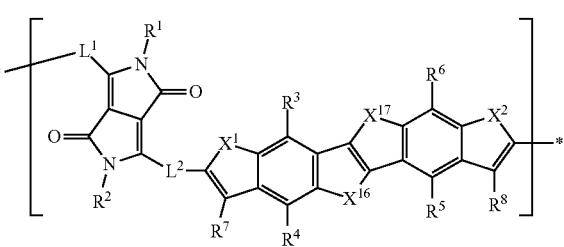

[Chemical Formula 1D-2]

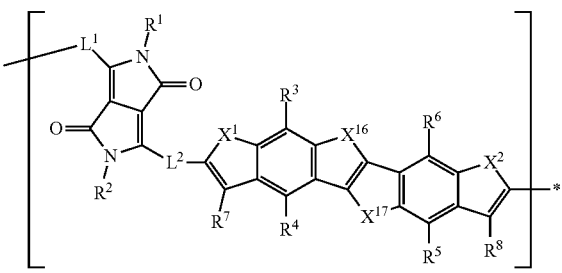

In Chemical Formula 1C-1, 1C-2, 1 D-1, or 1D-2, $X^1$, $X^2$, $X^{16}$, $X^{17}$, $L^1$, $L^2$, and $R^1$ to $R^8$ are the same as described above.

The polymer may further include a structural unit other than the aforementioned structural unit, in addition to the aforementioned structural unit.

The polymer may be for example represented by one of Chemical Formulae 2 to 5.

[Chemical Formula 2]

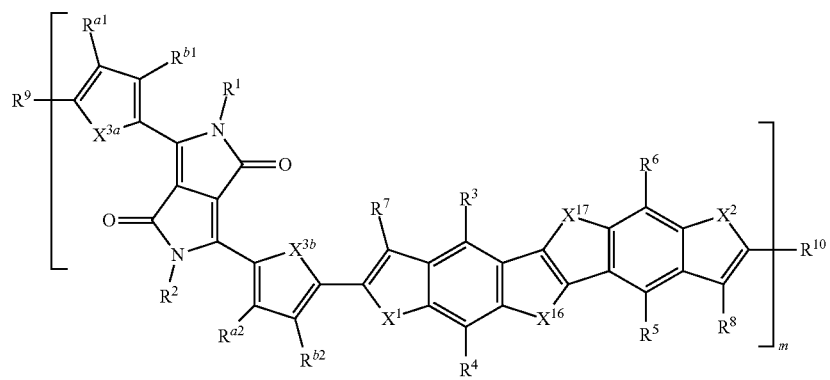

[Chemical Formula 3]

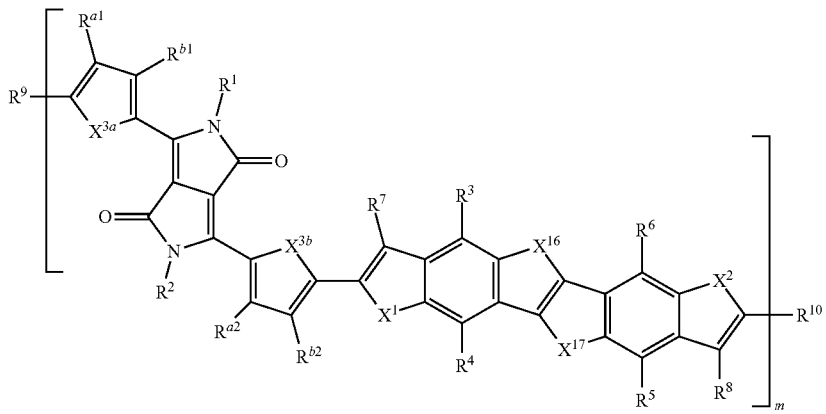

[Chemical Formula 4]

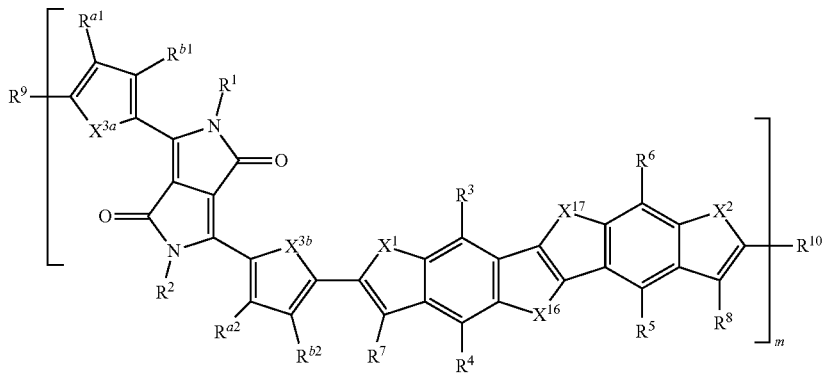

[Chemical Formula 5]

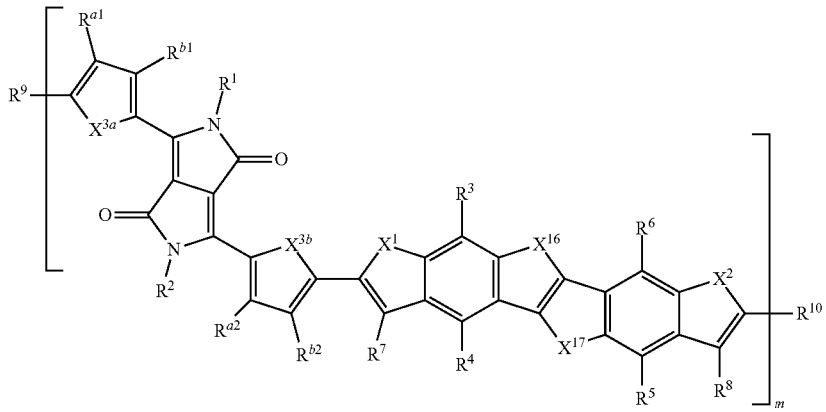

In Chemical Formulae 2 to 5, $X^1$, $X^2$, $X^{16}$, $X^{17}$, $L^1$, $L^2$, and $R^1$ to $R^8$ are the same as described above, $X^{3a}$ and $X^{3b}$ may each independently be O, S, Se, or Te, $R^{a1}$, $R^{b1}$, $R^{a2}$, and $R^{b2}$ may each independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, The m may be the number of structural units, for example 2 to 1000, 2 to 800, 5 to 800, 5 to 700, 5 to 500 or 5 to 300.

A weight average molecular weight of the polymer may be about 5,000 Da to about 500,000 Da, about 10,000 Da to about 300,000 Da, or about 30,000 Da to about 200,000 Da.

The aforementioned polymer may be formed into an organic thin film. The organic thin film may be a deposition thin film formed by a deposition or a coating thin film formed by a solution process. As described above, since the polymer has good solubility with respect to organic solvents, the organic thin film may be a coating thin film formed by a solution process.

The organic thin film may further include a binder and/or an elastomer in addition to the aforementioned polymer. The binder may improve dispersion of the aforementioned polymer and may be for example polystyrene, but is not limited. The elastomer may be blended with the aforementioned polymer to provide stretchability, for example polyorganosiloxane, polyamide, polyimide, polyamideimide, polyisobutene, polyolefin, polyester, polyurethane, or a combination particular, but is not limited thereto.

The organic thin films may be applied to various devices requiring organic semiconductors due to high charge mobility. For example, the organic thin film may be applied to various devices requiring stretching characteristics due to high stretchability.

For example, the organic thin film including the aforementioned polymer may be applied to a thin film transistor, and may be applied to a charge transport layer and/or an active layer of an electronic device such as a solar cell, an organic light emitting diode (OLED) display, and an organic sensor. The electronic device may be for example flexible and stretchable electronic device, and may be a wearable device and/or a skin-like device.

Hereinafter, one example of a thin film transistor including the aforementioned compound is described referring to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1B:
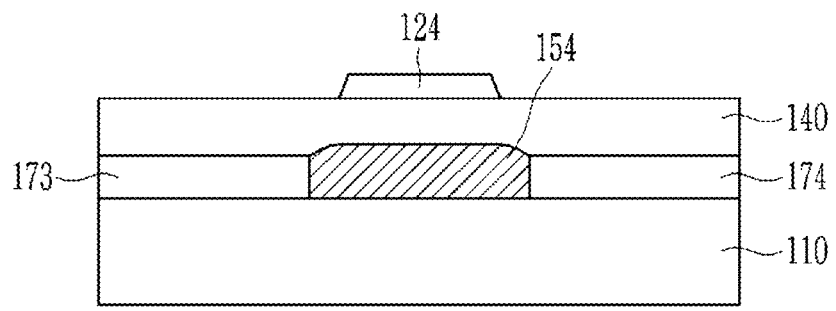
Figure 1C:
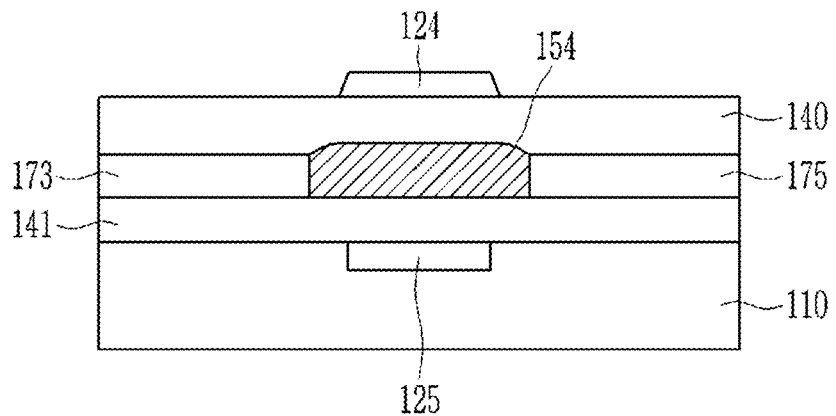

FIGS. 1A to 1C are cross-sectional views of a thin film transistor according to embodiments.

Referring to FIGS. 1A to 1C, thin film transistors according to embodiments include a gate electrode 124, an organic semiconductor 154 overlapping the gate electrode 124, and a source electrode 173 and a drain electrode 175 electrically connected to the organic semiconductor 154, respectively.

First, referring to FIG. 1A, a thin film transistor according to an embodiment may have a bottom gate and a bottom contact structure. For example, a thin film transistor according to an embodiment includes a gate electrode 124 formed on a substrate 110; a gate insulating layer 140 formed on a gate electrode 124; an organic semiconductor 154 formed on the gate insulating layer 140; and a source electrode 173 and a drain electrode 175 electrically connected to the organic semiconductor 154.

A gate electrode 124 is formed on a substrate 110 made of transparent glass, silicon, or plastic. The gate electrode 124 is connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof.

A gate insulating layer 140 is formed on the gate electrode 124. The gate insulating layer 140 may be made of an organic material and/or an inorganic material. Examples of the organic material may include a soluble polymer compound such as a polyvinyl alcohol-based compound, a polyimide-based compound, a polyacryl-based compound, a polystyrene-based compound, and benzocyclobutane (BCB), and examples of the inorganic material may include a silicon nitride ($SiN_x$) and a silicon oxide ($SiO_2$).

An organic semiconductor 154 is formed on the gate insulating layer 140. The organic semiconductor 154 may include the aforementioned polymer and may be the aforementioned organic thin film. The organic semiconductor 154 may be formed by preparing the aforementioned polymer in a solution form and using a solution process such as spin coating, slit coating or inkjet printing. The organic semiconductor 154 may be formed by vacuum deposition or thermal evaporation of the aforementioned polymer.

A source electrode 173 and a drain electrode 175 are formed on the organic semiconductor 154. The source electrode 173 and the drain electrode 175 may face each other on the organic semiconductor 154 in the center of the gate electrode 124. The source electrode 173 is electrically connected to the data line (not shown) transferring the data signal. The source electrode 173 and the drain electrode 175 may include at least one metal selected from gold (Au), copper (Cu), nickel (Ni), aluminum (Al), molybdenum (Mo), chromium (Cr), tantalum (Ta), titanium (Ti), an alloy thereof, or a combination thereof.

Referring to FIG. 1B, a thin film transistor according to the present embodiment, different from the above embodiment, may have a top gate and a top contact structure. For example, a thin film transistor according to the present embodiment includes an organic semiconductor 154 formed on a substrate 110; a source electrode 173 and a drain electrode 175 electrically connected to the organic semiconductor 154; a gate insulating layer 140 formed on the organic semiconductor 154, the source electrode 173 and the drain electrode 175; and a gate electrode 124 formed on the gate insulating layer 140.

Referring to FIG. 1C, a thin film transistor according to the present embodiment, different from the above embodiments, may have a dual gate and a bottom/top contacts structure. For example, a thin film transistor according to the present embodiment includes an organic semiconductor 154 formed on a substrate 110; a first gate electrode 125 positioned under the organic semiconductor 154; a second gate electrode 124 positioned on the organic semiconductor 154; a first gate insulating layer 141 between the organic semiconductor 154 and the first gate electrode 125; a second gate insulating layer 140 between the organic semiconductor 154 and the second gate electrode 124; and a source electrode 173 and a drain electrode 175 electrically connected to the organic semiconductor 154. The first gate electrode 125 may be embedded in the substrate 110 or formed by doping p-type or n-type impurities. The first gate electrode 125, the organic semiconductor 154, and the second gate electrode 124 may overlap each other.

Although some thin film transistors are described as examples, inventive concepts are not limited thereto, and may be applied to all thin film transistors.

The thin film transistor may be applied to a switch and/or driving device of various electronic devices, and the electronic device may be, for example, a liquid crystal display (LCD), an organic light emitting diode (OLED) display, an eletrophoretic display device, or an organic sensor, but is not limited thereto. The electronic device including the thin film transistor may be for example flexible and stretchable electronic device, and may be a wearable device and/or a skin-like device.

Hereinafter, the embodiments are illustrated in more detail with reference to examples. However, these examples are non-limiting, and inventive concepts are not limited thereto.

SYNTHESIS OF POLYMER

Synthesis Example 1

[Reaction Scheme 1]

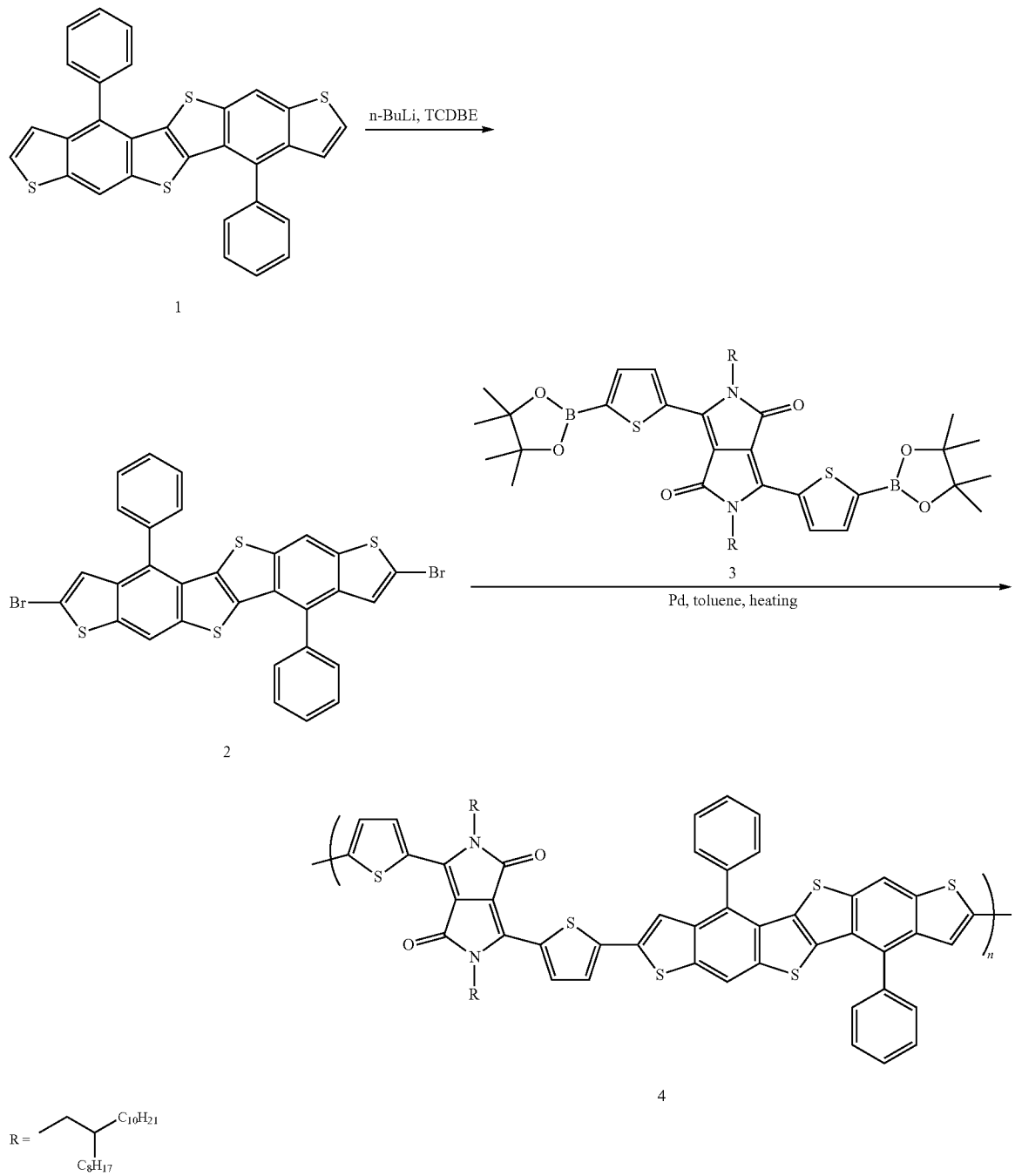

Synthesis of Compound 1

Compound 1 is obtained according to a synthesis method described in *J. Am. Chem. Soc.* 2015, 137, 12175-12178, except that a carbonyl group is generated through oxidation of a hydroxyl group after introducing a phenyl group into an aldehyde group before the last cyclization reaction.

1H-NMR (300 MHz, CDCl3): δ8.19 (s, 1H), 7.64 (m, 3H), 7.57 (m, 2H), 7.36 (d, 1H), 7.12 (d, 1H),

MALDI-ToF-MS (m/z) [M]+ calcd for $C_{30}H_{16}S_4$ 504.013; found 503.925.

Synthesis of Compound 2

0.92 g (1.82 mmol) of Compound 1 is added to 200 ml of tetrahydrofuran to prepare a cooling solution (−78° C.), n-butyllithium (2.5 M in hexane, 2.94 mL, 4 eq.) is added to the solution, and the obtained reaction mixture is fervently stirred for 3 minutes. Subsequently, 2.4 g (7.37 mmol, 4 eq.) of tetrachlorodibromoethane (TCDBE) is added thereto. Then, the reaction mixture is stirred at −78° C. for 5 minutes and then, neutralized by adding an $NH_4Cl$-saturated solution thereto to separate an organic layer. The solvent of the separated organic layer is removed with a rotary distiller, dimethylchloride is added thereto, a material precipitated therein is obtained through a filter, dissolved in chloroform, and extracted to obtain Compound 2. A yield thereof is 62.2%.

1H-NMR (300 MHz, $CDCl_3$): δ 8.02 (s, 1H), 7.64 (m, 3H), 7.51 (m, 2H), 7.09 (s, 1H),

MALDI-ToF-MS (m/z): [M]+ calcd for $C_{30}H_{14}Br_2S_4$ 661.83; found 661.708.

Synthesis of Compound 4 (Final Compound)

59.5 mg (0.09 mmol) of Compound 2, 100 mg (0.09 mmol) of Compound 3, 3 mg (0.003 mmol) of tris(dibenzylideneacetone)dipalladium (0) ($Pd_2(dba)_3$), 6 mg (0.006 mmol) of tri(o-tolyl)phosphine ($P(o-tol)_3$), 0.6 mL of 1 M $K_3PO_4$, and 2 drops of Aliquot 336 are put in a 50 mL round-bottomed flask. 15 mL of degassed anhydrous toluene is added thereto and then, stirred at 90° C. for 48 hours. Subsequently, the reaction solution is washed with water and added to 500 mL of methanol, and a precipitate therein is obtained through a filter. The obtained material is purified by using methanol, acetone, and dimethylchloride respectively for 24 hours by using a Soxhlet purifier and then, extracted by using chloroform. Then, methanol is added to the extracted solution, and a precipitate generated therein is obtained through a filter and dried to obtain Compound 4. A yield thereof is 49%.

Molecular weight measured by high temperature GPC
Mn: 60774, Mw: 87946

Manufacture of Organic Thin Film Transistor

Example

Compound 4 obtained by the Synthesis Example at a concentration of 1 wt % is dissolved in chloroform to prepare an organic semiconductor solution. The organic semiconductor solution is spin coated at 1000 rpm on a silicon wafer substrate coated with $SiO_2$ to be 3000 Å thick and then annealed for 1 hour at 150° C. under a nitrogen atmosphere to form an organic semiconductor layer. Subsequently, gold (Au) is thermally deposited on the organic semiconductor layer by using a shadow mask to form source and drain electrodes to manufacture a thin film transistor. The channel dimension (W/L) (W: channel width, L: channel length) of the thin film transistor is about 1000 μm/100 μm.

Comparative Example

A thin film transistor is manufactured according to the same method as Example except that DPP-DTT (Poly[2,5-(2-octyldodecyl)-3,6-diketopyrrolopyrrole-alt-5,5-(2,5-di(thien-2-yl)thieno[3,2-b]thiophene)])(CAS No. 1260685-66-2) is used instead of Compound 4 obtained by the Synthesis Example.

Evaluation

Electrical characteristics of the thin film transistors according to Example and Comparative Example are calculated under a gate voltage (0 to 40V) and a drain voltage (−40V).

The results are shown in Table 1 and FIGS. 2 to 5.

Figure 2:
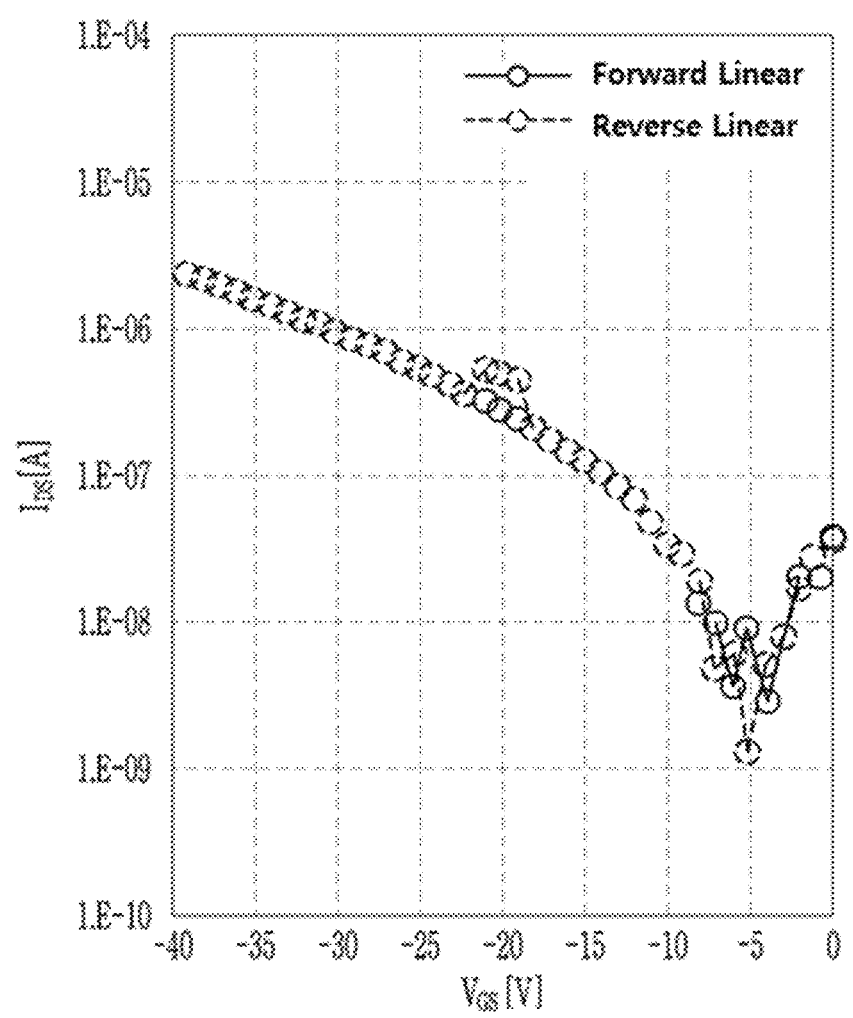
FIG. 2 is a graph showing current characteristics depending on gate voltages of thin film transistor according to Example.
Figure 3:
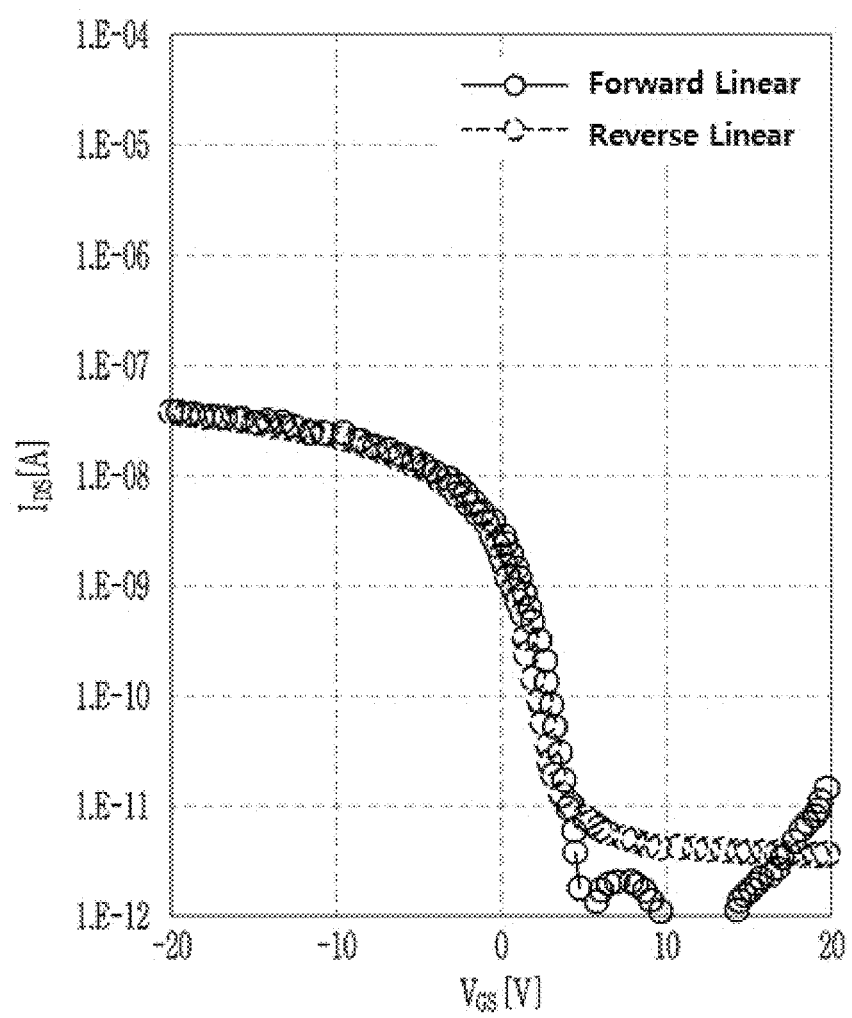
FIG. 3 is a graph showing current characteristics depending on a gate voltage of thin film transistor according to Comparative Example.
Figure 4:
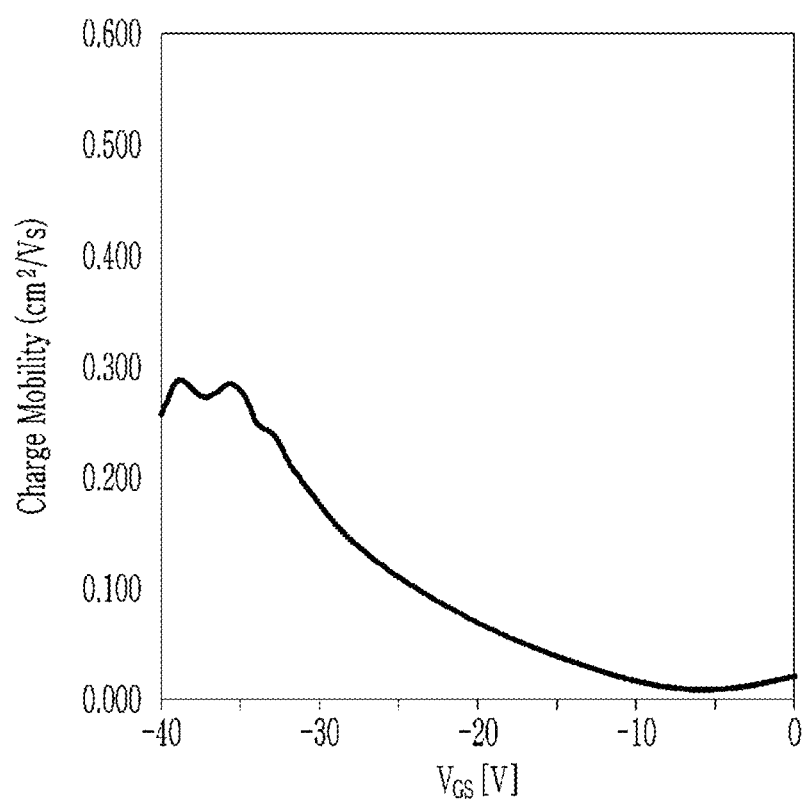
FIG. 4 is a graph showing charge mobility depending on gate voltages of thin film transistor according to Example.
Figure 5:
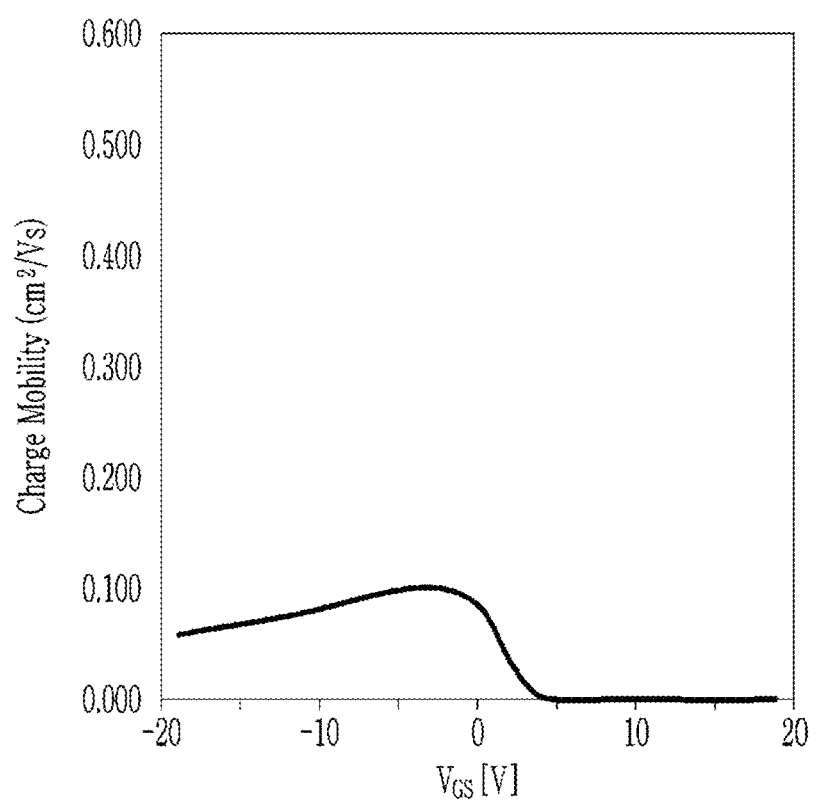
FIG. 5 is a graph showing charge mobility depending on gate voltages of thin film transistor according to Comparative Example.

FIG. 2 is a graph showing current characteristics depending on gate voltages of thin film transistor according to Example, FIG. 3 is a graph showing current characteristics depending on a gate voltage of thin film transistor according to Comparative Example, FIG. 4 is a graph showing charge mobility depending on gate voltages of thin film transistor according to Example, and FIG. 5 is a graph showing charge mobility depending on gate voltages of thin film transistor according to Comparative Example.

TABLE 1

|  | Charge Mobility ($cm^2$/Vs) |
|---|---|
| Example | 0.285 |
| Comparative Example | 0.104 |

Referring to Table 1 and FIGS. 2 to 5, it may be confirmed that the thin film transistor according to Example has improved current characteristics and higher charge mobility compared with the thin film transistor according to Comparative Example.

While this disclosure has been described in connection with what is presently considered to be practical example embodiments, it is to be understood inventive concepts are not limited to the disclosed embodiments. On the contrary, inventive concepts cover various modifications and equivalent arrangements included within the spirit and scope of the appended claims.

What is claimed is:
1. A polymer comprising:
at least one structural unit, the at least one structural unit including a moiety represented by Chemical Formula 1,

[Chemical Formula 1]

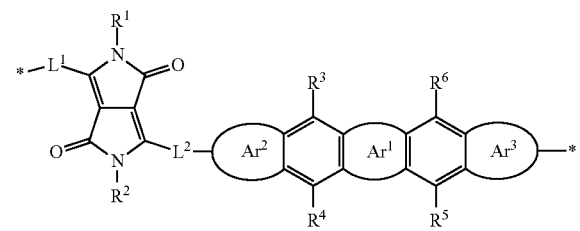

wherein, in Chemical Formula 1,
Ar¹ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene,
Ar² and Ar³ are each independently a substituted or unsubstituted furan, a substituted or unsubstituted thiophene, a substituted or unsubstituted selenophene, or a substituted or unsubstituted tellurophene,
L¹ and L² are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^6$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point, and wherein substituted refers to a replacement of hydrogen in a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

2. The polymer of claim 1, wherein the moiety represented by Chemical Formula 1 is represented by Chemical Formula 1A or 1B:

[Chemical Formula 1A]

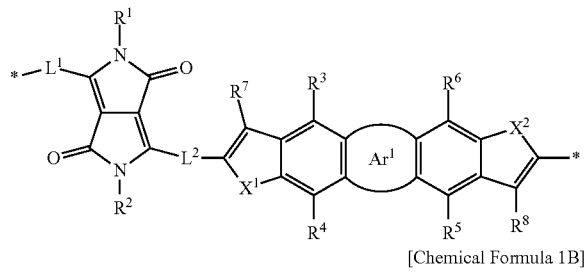

[Chemical Formula 1B]

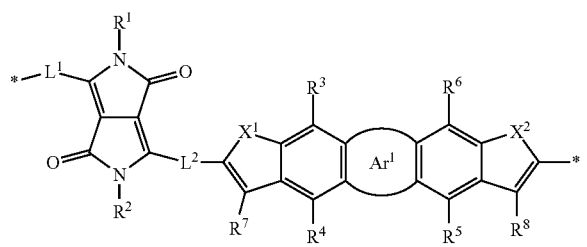

wherein, in Chemical Formula 1A or 1B, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $X^1$ and $X^2$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

3. The polymer of claim 1, wherein at least one of $L^1$ and $L^2$ is a divalent linking group comprising a substituted or unsubstituted C6 to C30 arylene group, a divalent linking group comprising a substituted or unsubstituted C3 to C30 heterocyclic group comprising at least one of O, S, Se, Te, and N, or a combination thereof.

4. The polymer of claim 1, wherein $L^1$ and $L^2$ are each independently a divalent linking group comprising at least one substituted or unsubstituted furan, at least one substituted or unsubstituted thiophene, at least one substituted or unsubstituted selenophene, at least one substituted or unsubstituted tellurophene, at least one substituted or unsubstituted pyrrole, at least one substituted or unsubstituted benzene, or a fused ring of two or more foregoing groups.

5. The polymer of claim 1, wherein $L^1$ and $L^2$ are each independently one linking group among linking groups listed in Group 1:

[Group 1]

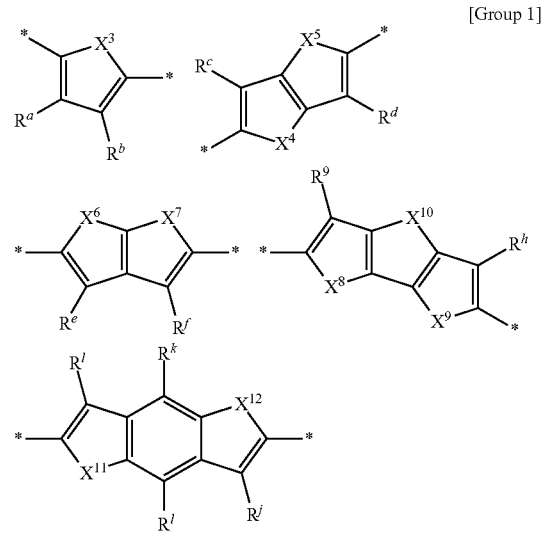

-continued

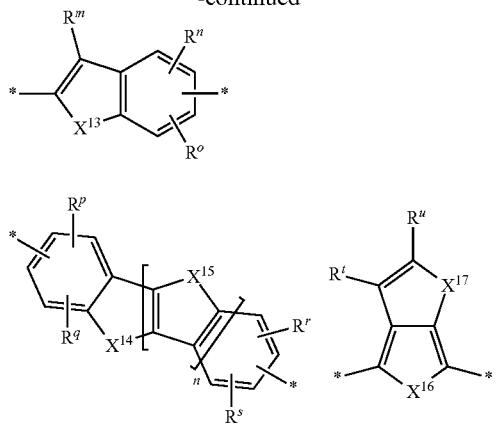

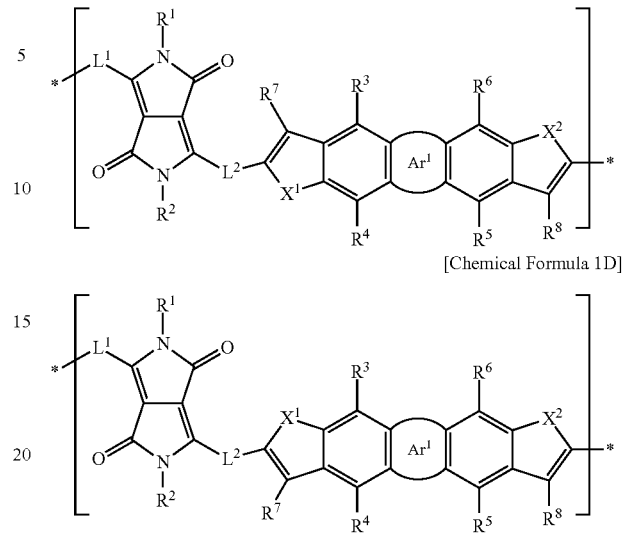

wherein, in Group 1, $X^3$ to $X^9$ and $X^{11}$ to $X^{17}$ are each independently O, S, Se, or Te, $X^{10}$ O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, n is 0, 1, or 2, and

* is a linking point.

6. The polymer of claim 1, wherein at least one of $R^3$ to $R^6$ is a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

7. The polymer of claim 1, wherein $R^3$ and $R^5$ are each independently a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof, and $R^4$ and $R^6$ are each hydrogen.

8. The polymer of claim 1, wherein at least one of $R^1$ and $R^2$ is a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

9. The polymer of claim 1, wherein the structural unit is represented by Chemical Formula 1C or 1D:

wherein, in Chemical Formula 1C or 1D, $Ar^1$ is furan, thiophene, selenophene, tellurophene, thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene, $X^1$ and $X^2$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

10. An organic thin film comprising:
the polymer of claim 1.

11. An electronic device comprising:
the organic thin film of claim 10.

12. A thin film transistor comprising:
a gate electrode,
an organic semiconductor overlapping the gate electrode, and
a source electrode and a drain electrode electrically connected to the organic semiconductor,
wherein the organic semiconductor comprises the polymer of claim 1.

13. An electronic device comprising:
the thin film transistor of claim 12.

14. The polymer of claim 1, wherein $Ar^1$ is thienofuran, thienothiophene, thienoselenophene, thienotellurophene, a substituted or unsubstituted benzofuran, a substituted or unsubstituted benzothiophene, a substituted or unsubstituted benzoselenophene, or a substituted or unsubstituted benzotellurophene.

15. A polymer comprising:
at least one structural unit including a moiety represented by one of Chemical Formulas 1A-1, 1A-2, 1B-1, or 1B-2:

[Chemical Formula 1A-1]

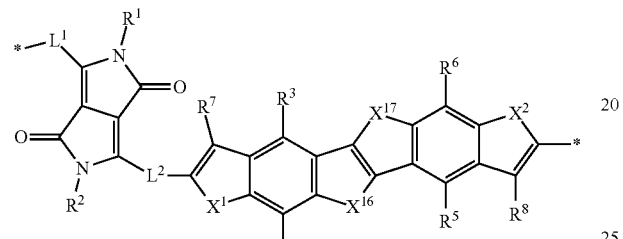

[Chemical Formula 1A-2]

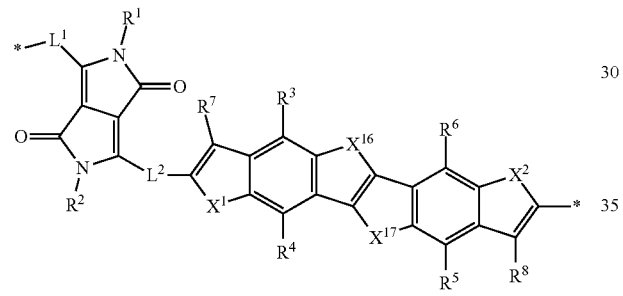

[Chemical Formula 1B-1]

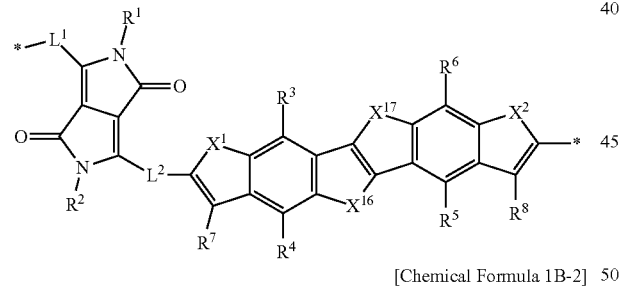

[Chemical Formula 1B-2]

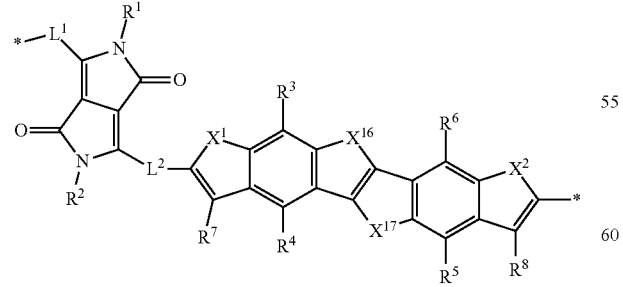

wherein, in Chemical Formula 1A-1, 1A-2, 1B-1, or 1B-2,
$X^1$, $X^2$, $X^{16}$, and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point, and wherein substituted refers to a replacement of hydrogen in a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

16. The polymer of claim 9, wherein
the structural unit represented by Chemical Formula 1C is represented by Chemical Formula 1C-1 or 1C-2, and
the structural unit represented by Chemical Formula 1D is represented by Chemical Formula 1D-1 or 1D-2:

[Chemical Formula 1C-1]

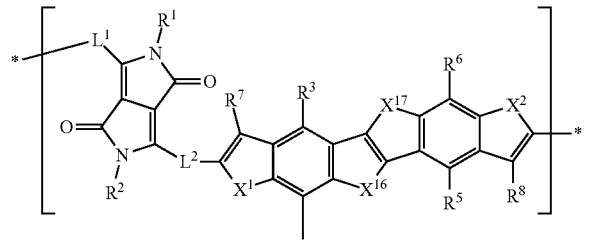

[Chemical Formula 1C-2]

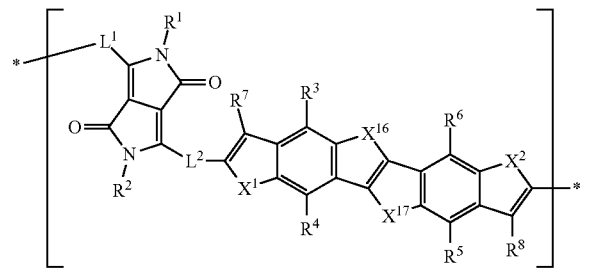

-continued

[Chemical Formula 1D-1]

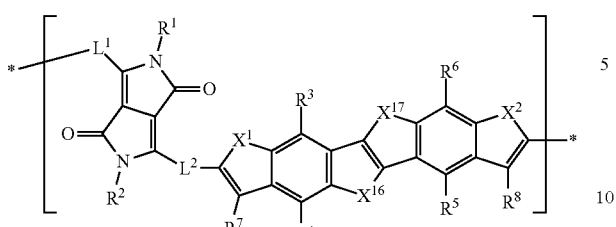

[Chemical Formula 1D-2]

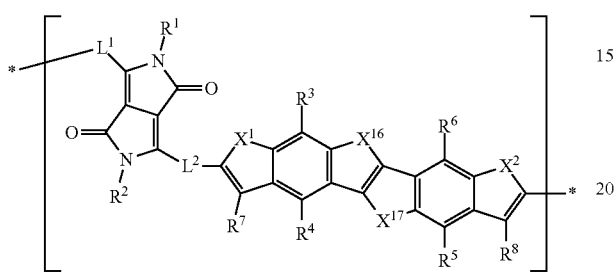

wherein, in Chemical Formula 1C-1, 1C-2, 1D-1, or 1D-2, $X^1$, $X^2$, $X^{16}$, and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^8$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and

* is a linking point.

17. The polymer of claim 16, wherein $L^1$ and $L^2$ are each independently one linking group among linking groups of Group 1:

[Group 1]

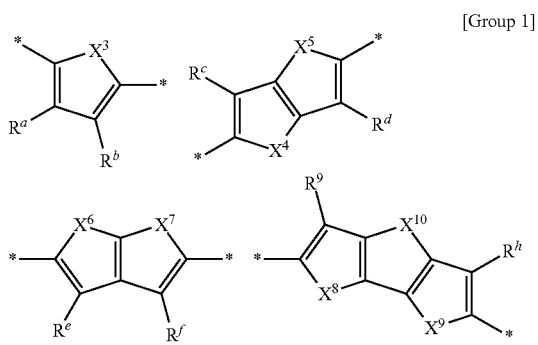

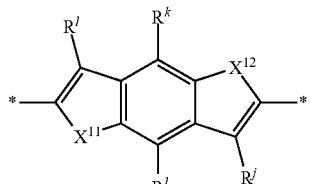

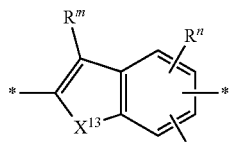

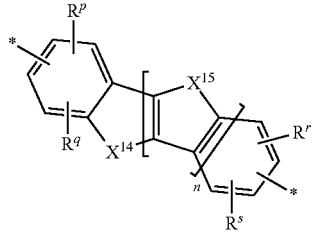

wherein, in Group 1, $X^3$ to $X^9$ and $X^{11}$ to $X^{17}$ are each independently O, S, Se, or Te, $X^{10}$ is O, S, Se, Te, $NR^v$, $CR^wR^x$, or $SiR^yR^z$, $R^a$ to $R^z$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, n is 0, 1, or 2, and

* is a linking point.

18. The polymer of claim 16, wherein at least one of $R^3$ to $R^6$ is a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

19. The polymer of claim 16, wherein $R^3$ and $R^5$ are each independently a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof, and $R^4$ and $R^6$ are hydrogen.

20. A polymer is represented by one of Chemical Formulae 2 to 5:
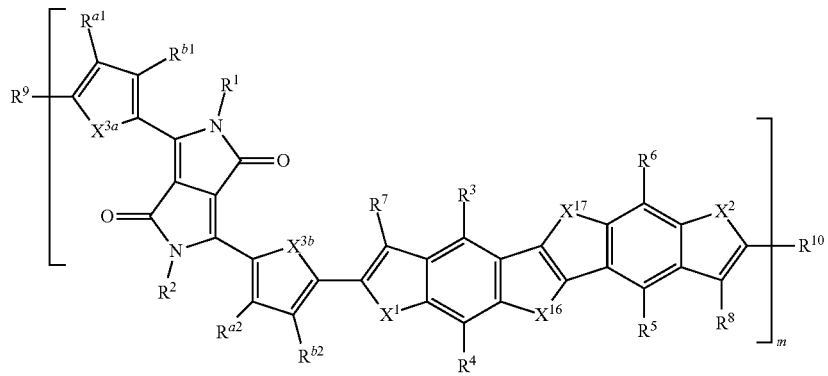
[Chemical Formula 2]
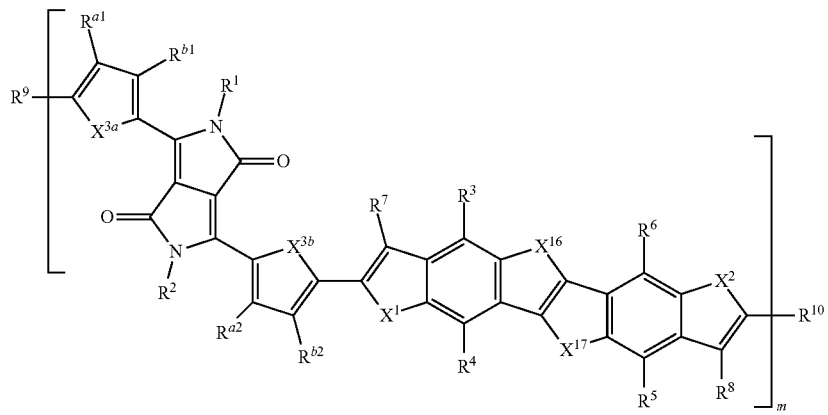
[Chemical Formula 3]
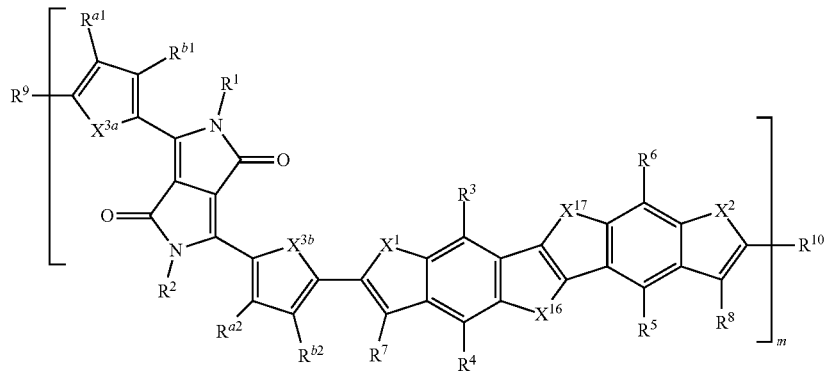
[Chemical Formula 4]
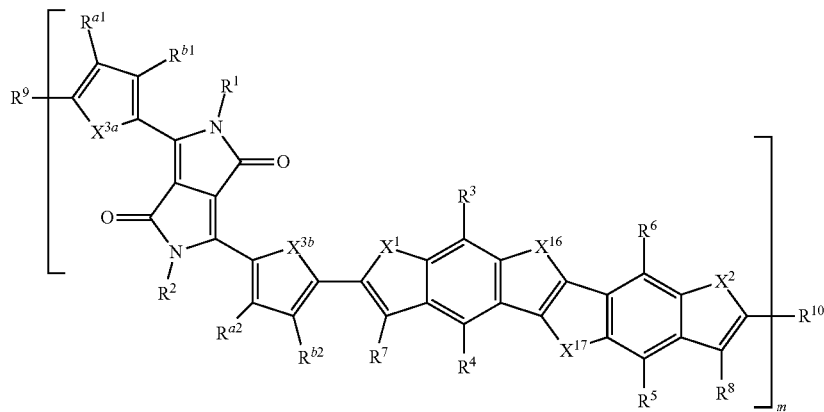
[Chemical Formula 5]

wherein, in Chemical Formulae 2 to 5, $X^1$, $X^2$, $X^{3a}$, $X^{3b}$, $X^{16}$ and $X^{17}$ are each independently O, S, Se, or Te, $L^1$ and $L^2$ are each independently a single bond, a substituted or unsubstituted C1 to C20 alkylene group, a substituted or unsubstituted C6 to C30 arylene group, a substituted or unsubstituted C3 to C30 heterocyclic group, a fused ring thereof, or a combination thereof, $R^1$ to $R^{10}$, $R^{a1}$, $R^{b1}$, $R^{a2}$, and $R^{b2}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or a combination thereof, and m is 5 to 300, and wherein substituted refers to a replacement of hydrogen in a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

21. The polymer of claim 20, wherein at least one of $R^3$ to $R^6$ is a substituted or unsubstituted C1 to C30 linear alkyl group, a substituted or unsubstituted C3 to C30 branched alkyl group, a substituted or unsubstituted C6 to C30 aryl group, a substituted or unsubstituted C3 to C30 heterocyclic group, or a combination thereof.

* * * * *